(12) United States Patent
He

(10) Patent No.: US 10,672,803 B2
(45) Date of Patent: Jun. 2, 2020

(54) DISPLAY PANEL AND DISPLAY DEVICE

(71) Applicant: Shenzhen China Star Optoelectronics Semiconductor Display Technology Co., Ltd., Shenzhen, Guangdong (CN)

(72) Inventor: Wenchao He, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/100,187

(22) Filed: Aug. 9, 2018

(65) Prior Publication Data

US 2019/0206897 A1  Jul. 4, 2019

Related U.S. Application Data

(63) Continuation of application No. PCT/CN2018/077090, filed on Feb. 24, 2018.

(30) Foreign Application Priority Data

Dec. 29, 2017 (CN) .......................... 2017 1 1498127

(51) Int. Cl.
*H01L 27/12* (2006.01)
*G09G 3/20* (2006.01)
(Continued)

(52) U.S. Cl.
CPC .......... *H01L 27/124* (2013.01); *G02F 1/1368* (2013.01); *G02F 1/13439* (2013.01);
(Continued)

(58) Field of Classification Search
CPC ............. G02F 1/134363; G02F 1/1356; G02F 1/13439; G02F 1/136213; G02F 1/136227; G02F 1/136286
See application file for complete search history.

(56) References Cited

U.S. PATENT DOCUMENTS 8,502,211 B2 8/2013 Lee et al.
2009/0195855 A1* 8/2009 Steyn .................... G02B 26/02
359/290

(Continued)

FOREIGN PATENT DOCUMENTS

CN 103926722 A 7/2014
CN 203894508 U 10/2014
CN 104460144 A 3/2015

OTHER PUBLICATIONS

First Office Action from China patent office in a counterpart Chinese Patent application No. 201711498127.0 dated Dec. 27, 2019.

*Primary Examiner* — Seahvosh Nikmanesh

(57) ABSTRACT

The present disclosure discloses a display panel, and the display panel includes: a first substrate and a second substrate; a plurality of first gate lines and a plurality of first data lines arranged on the first substrate, a plurality of second gate lines and a plurality of second data lines arranged on the second substrate, wherein a plurality of first pixel areas are defined by the plurality of first gate lines and the plurality of first data lines, and a plurality of second pixel areas are defined by the plurality of second gate lines and the plurality of second data lines; the projections of the portion of the plurality of first pixel areas with the first thin film transistors projected on the second substrate is located between at least two adjacent second pixel areas with the second thin film transistors.

17 Claims, 9 Drawing Sheets

(51) Int. Cl.
*H01L 21/02* (2006.01)
*G02F 1/1343* (2006.01)
*G02F 1/1368* (2006.01)

(52) U.S. Cl.
CPC ......... *G02F 1/134363* (2013.01); *G09G 3/20* (2013.01); *H01L 21/0217* (2013.01); *H01L 21/0262* (2013.01); *H01L 21/02271* (2013.01); *H01L 27/1214* (2013.01); *G09G 2300/0439* (2013.01)

(56) References Cited

U.S. PATENT DOCUMENTS

| | | |
|---|---|---|
| 2013/0215341 A1 | 8/2013 | Rho et al. |
| 2014/0210876 A1 | 7/2014 | Xie |
| 2015/0279914 A1 | 10/2015 | Qin |
| 2018/0019377 A1* | 1/2018 | Kim ........................ H01L 33/16 |
| 2018/0180915 A1 | 6/2018 | Xu |

* cited by examiner

DISPLAY PANEL AND DISPLAY DEVICE

CROSS-REFERENCE TO RELATED APPLICATIONS

The present application is a continuation-application conversion of International (PCT) Patent Application No. PCT/CN2018/077090 filed on Feb. 24, 2018, which claims foreign priority of Chinese Patent Application No. 201711498127.0, filed on Dec. 29, 2017 in the State Intellectual Property Office of China, the contents of all of which are hereby incorporated by reference.

TECHNICAL FIELD

Embodiments of the present disclosure generally relate to display technology, and in particular relate to a display panel and a display device.

BACKGROUND

With the development of display panel technology, more and more high resolution (such as 4K, 2K; 8K, 4K; 16K, 8K) has become the technical goal that people pursue. However, with the increase of the resolution, the charging index of the panel is increasing rapidly. The increasing charging index, namely, RC (R indicates an electrical resistance value, C indicates a capacitance value) will make colors displayed on the panel uneven; at the same time, the increasing of the resolution will also lead to a sharp reducing of the charging time, for example, in the case of constant frequency, a charging time for 2K, 1K is t, a charging time for 4K, 2K is t/2, a charging time for 8K, 4K is t/4, and a charging time for 16K, 8K is t/8, and insufficient charging will affect a penetration rate of the display panel. Due to the superposition of these factors, the display effect and the penetration rate of liquid display panel are seriously affected. Moreover, due to the influence of manufacturing processes of the thin film transistor, boundaries respectively of two adjacent thin film transistors at least partially overlap, and color deviations will be produced in overlapped regions, which will affects the display effect.

SUMMARY

The technical problem to be solved by the present disclosure is to provide a display panel and display device, which are used to solve the problems of poor display effect and insufficient charging of panel in the high resolution display panel in the existing technology.

In order to solve the above-mentioned technical problem, a technical scheme adopted by the present disclosure is: providing a display panel, including: a first substrate and a second substrate; a plurality of first gate lines arranged on the first substrate and a plurality of second gate lines arranged on the second substrate; a plurality of first data lines arranged on the first substrate and a plurality of second data lines arranged on the second substrate, wherein a plurality of first pixel areas are defined by the plurality of first gate lines and the plurality of first data lines; and a plurality of second pixel areas are defined by the plurality of second gate lines and the plurality of second data lines; when the first substrate and the second substrate are stacked on one another, each of the plurality of first pixel areas and a corresponding second pixel area are aligned with each other, such that a pixel area is formed by each of the plurality of first pixel areas and the corresponding second pixel area; and a plurality of photoresists, wherein a portion of the plurality of photoresists are arranged on the first substrate, and the others of the plurality of photoresists are arranged on the second substrate; the portion of the plurality of photoresists on the first substrate and the others of the plurality of photoresists on the second substrate are arranged alternately, such that the plurality of photoresists are distributed in the plurality of pixel areas when the first substrate and the second substrate are stacked on one another; wherein a plurality of first thin film transistors are disposed in a portion of the plurality of first pixel areas, and a plurality of second thin film transistors are disposed in a portion of the plurality of second pixel areas, such that projections of the portion of the plurality of first pixel areas with the first thin film transistors projected on the second substrate are located between at least two adjacent second pixel areas with the second thin film transistors; wherein wherein the projections of the portion of the plurality of first pixel areas with the first thin film transistors projected on the second substrate and the portion of the plurality of second pixel areas with the second thin film transistors are arranged alternately In order to solve the above-mentioned technical problem, the second technical scheme adopted by the present disclosure is: providing a display panel, including: a first substrate and a second substrate; a plurality of first gate lines arranged on the first substrate and a plurality of second gate lines arranged on the second substrate; a plurality of first data lines arranged on the first substrate and a plurality of second data lines arranged on the second substrate, wherein a plurality of first pixel areas are defined by the plurality of first gate lines and the plurality of first data lines, and a plurality of second pixel areas are defined by the plurality of second gate lines and the plurality of second data lines; when the first substrate and the second substrate are stacked on one another, each of the plurality of first pixel areas and a corresponding second pixel area are aligned with each other, such that a pixel area is formed by each of the plurality of first pixel areas and the corresponding second pixel area; wherein a plurality of first thin film transistors are disposed in a portion of the plurality of first pixel areas, and a plurality of second thin film transistors are disposed in a portion of the plurality of second pixel areas, such that projections of the portion of the plurality of first pixel areas with the first thin film transistors projected on the second substrate are located between at least two adjacent second pixel areas with the second thin film transistors.

In order to solve the above-mentioned technical problem, the third technical scheme adopted by the present disclosure is: providing a display device, including a display panel, the display panel including a first substrate and a second substrate; a plurality of first gate lines arranged on the first substrate and a plurality of second gate lines arranged on the second substrate; a plurality of first data lines arranged on the first substrate and a plurality of second data lines arranged on the second substrate, wherein a plurality of first pixel areas are defined by the plurality of first gate lines and the plurality of first data lines, and a plurality of second pixel areas are defined by the plurality of second gate lines and the plurality of second data lines; when the first substrate and the second substrate are stacked on one another, each of the plurality of first pixel areas and a corresponding second pixel area are aligned with each other, such that a pixel area is formed by each of the plurality of first pixel areas and the corresponding second pixel area; wherein a plurality of first thin film transistors are disposed in a portion of the plurality of first pixel areas, and a plurality of second thin film transistors are disposed in a portion of the plurality of second pixel areas, such that projections of the portion of the plurality of first pixel areas with the first thin film transistors projected on the second substrate are located between at least two adjacent second pixel areas with the second thin film transistors.

In the embodiments of the present disclosure, a plurality of first gate lines and a plurality of first data lines are set on the first substrate 10, and a plurality of second gate lines and a plurality of second data lines are set on the second substrate 20, so that there may be two gate lines on different substrates working to charge the thin film transistors at the same time, and thus the charge efficiency is greatly increased, and the charging time is reduced by half. In addition, the technical problem of insufficient charging of the display panel is solved, the display effect of the display panel is improved, and the penetration rate of the display panel is enhanced. In addition, since the projections of the portion of the plurality of first pixel areas with the first thin film transistors projected on the second substrate are located between at least two adjacent second pixel areas with the second thin film transistors, the generation of the block boundary line between the adjacent thin film transistors can be reduced, the possibility of color deviation is reduced, and the display effect may be further improved.

DETAILED DESCRIPTION

Technical proposals of embodiments of the present disclosure will be described clearly and completely below. Apparently, the described embodiments are merely part of, rather than all of the embodiments of the present disclosure. Based on the described embodiments of the present disclosure, any other embodiment obtained by a person skilled in the art without paying creative efforts shall also fall within the scope of the present disclosure.

The terms "first" and "second" in the present disclosure are merely for illustrative purposes, and should not be construed as indicating or implying the relative importance, or implicitly indicating the number of indicated technical features. Thus, features defined with "first", "second" and "third" may explicitly or implicitly include at least one of the features. In the description of the present disclosure, "a plurality of" means at least two, for example, two, three, etc., unless expressly limited. All directional instructions (such as upper, lower, left, right, front, back . . . ) in the present disclosure are only used to explain the relative position relationship and motion between components in a particular attitude (as shown in the attached drawings), and when the particular attitude changes, the directional instructions will also be changed accordingly. In addition, the terms "include", "have" and any variation thereof are intended to encompass the items listed thereafter and equivalents thereof as well as additional items. For example, a process, a method, a system, a product or a device that includes a series of steps or components is not limited to these steps or components already listed, instead, it may optionally include many inherent steps or components not listed here.

The term "embodiment" recited in the present disclosure means that, specific features, structures or properties described with reference to the embodiment can be included in at least one embodiment of the present disclosure. The terms "embodiment" used in different positions of the specification does not always refer to the same embodiment, and does not indicate that this embodiment is the embodiment exclusive and independent from other embodiments, or the alternative embodiment of other embodiments. One skilled in the art may explicitly or implicitly understands that, the embodiment described in the present disclosure can be combined with other embodiments.

Figure 1:
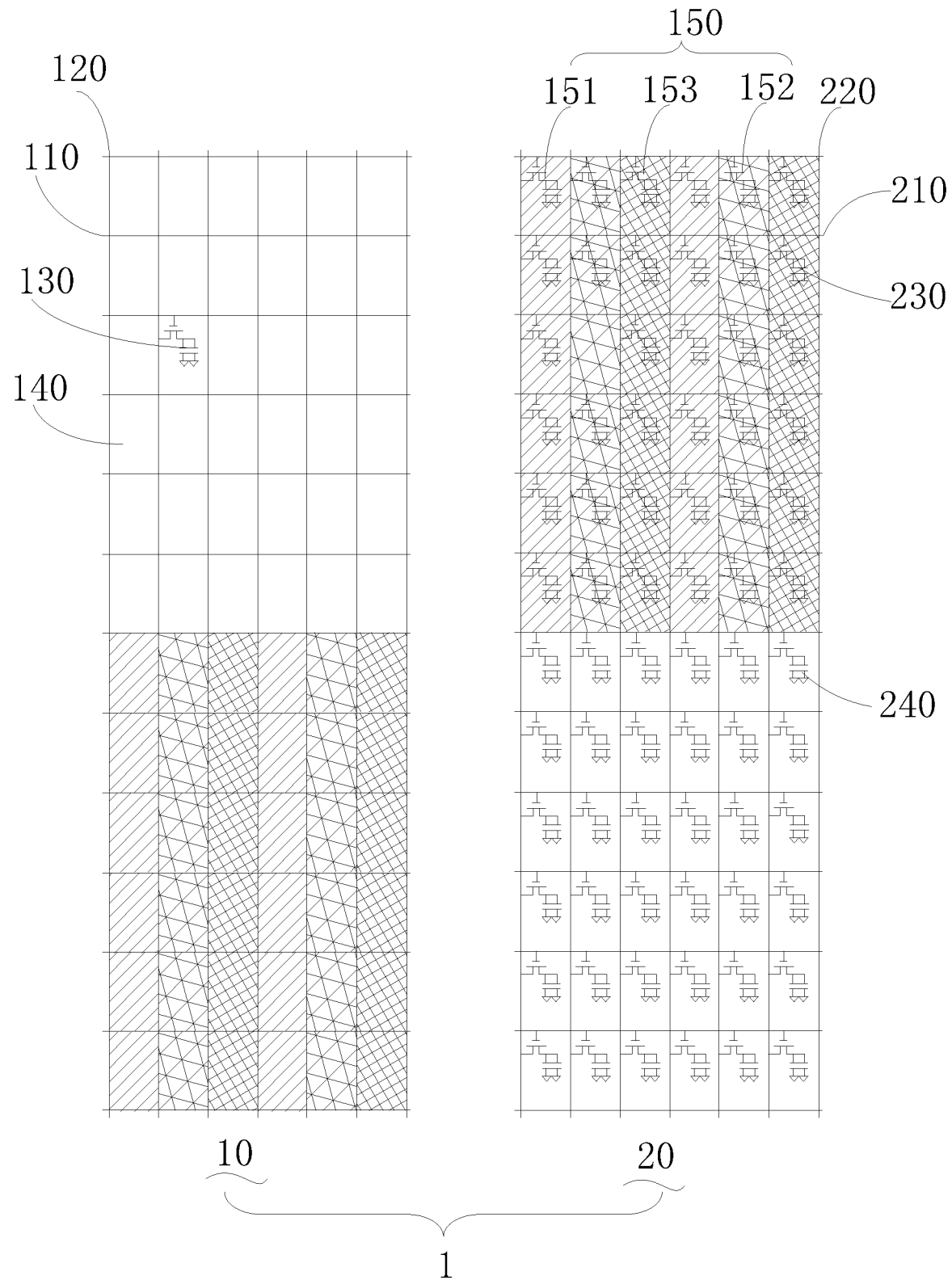
FIG. 1 is a schematic view of a first embodiment of a display panel.

Referring to FIG. 1, FIG. 1 is a schematic view of a first embodiment of a display panel. The display panel 1000 may include a first substrate 10 and a second substrate 20. The first substrate 10 may be provided with a plurality of first gate lines 110, a plurality of first data lines 120 and at least one first thin film transistor 130. In this embodiment, a plurality of first pixel areas 140 are defined by the plurality of first gate lines 110 and the plurality of first data lines 120, and a plurality of first thin film transistors 130 are disposed in a portion of the plurality of first pixel areas 140. The second substrate 20 may be provided with a plurality of second gate lines 210, a plurality of second data lines 220, and at least one second thin film transistor 230. A plurality of second pixel areas 240 are defined by the plurality of second gate lines 210 and the plurality of second data lines 220, and a plurality of second thin film transistors 230 are disposed in a portion of the plurality of second pixel areas 240. A projection of at least one of the portion of the plurality of first pixel areas 140 with the first thin film transistors 130 projected on the second substrate 20 may be located between at least two adjacent second pixel areas 240 with the second thin film transistors 230.

In this embodiment, when the first substrate 10 and the second substrate 20 are stacked on one another, each of the plurality of first pixel areas 140 and a corresponding second pixel area 240 are aligned with each other, such that a pixel area is formed by each of the plurality of first pixel areas 140 and the corresponding second pixel area 240.

For example, as shown in FIG. 1, only one first thin film transistor 130 is provided on the first substrate 10. The first thin film transistor 130 may be arranged in only one first pixel area 140. On the second substrate 20, except for the second pixel area 240 that corresponds to the first pixel area 140 with the first thin film transistor 130, each of the other second pixel areas 240 may be provided a second thin film transistor 230. In this way, the projection of the first pixel area 140 with the first thin film transistor 130 on the second substrate 20 may be located among four adjacent second pixel areas 240 with second thin film transistors 230.

In this embodiment, by arranging the plurality of first gate lines 110 and the plurality of first data lines 120 on the first substrate 10, and arranging the plurality of second gate lines 210 and the plurality of second data lines 220 on the second substrate 20, it is possible that two gate lines on different substrates may be working at the same time to charge the at least one thin film transistor. In this way, the charge efficiency may be greatly improved, thereby reducing the charging time by half. The technical problem of insufficient charging of the display panel may be solved, the display effect of the display panel may be improved, and the penetration rate of the display panel may be enhanced. In addition, since the projection of the first pixel area 140 with the first thin film transistor 130 on the second substrate 20 is located between at least two adjacent second pixel areas 240 with second thin film transistors 230, the generation of the block boundary line between the adjacent thin film transistors may be reduced, the possibility of color deviations may be reduced, and the display effect may be further improved.

In this embodiment, the first substrate 10 and the second substrate 20 may be made of transparent materials, for example, the first substrate 10 and the second substrate 20 may be one substrate in any form, such as a glass substrate, a ceramic substrate, a transparent plastic substrate, or the like. The material of the first substrate 10 and the second substrate 20 will not be specifically limited in the present disclosure. The manufacturing methods and processes of the gate lines, the data lines and the thin film transistors are well known to those skilled in the art, and can also refer to the manufacturing methods and processes in the existing technology. Therefore, those manufacturing methods and processes will not be specifically limited in the present disclosure.

Figure 2:
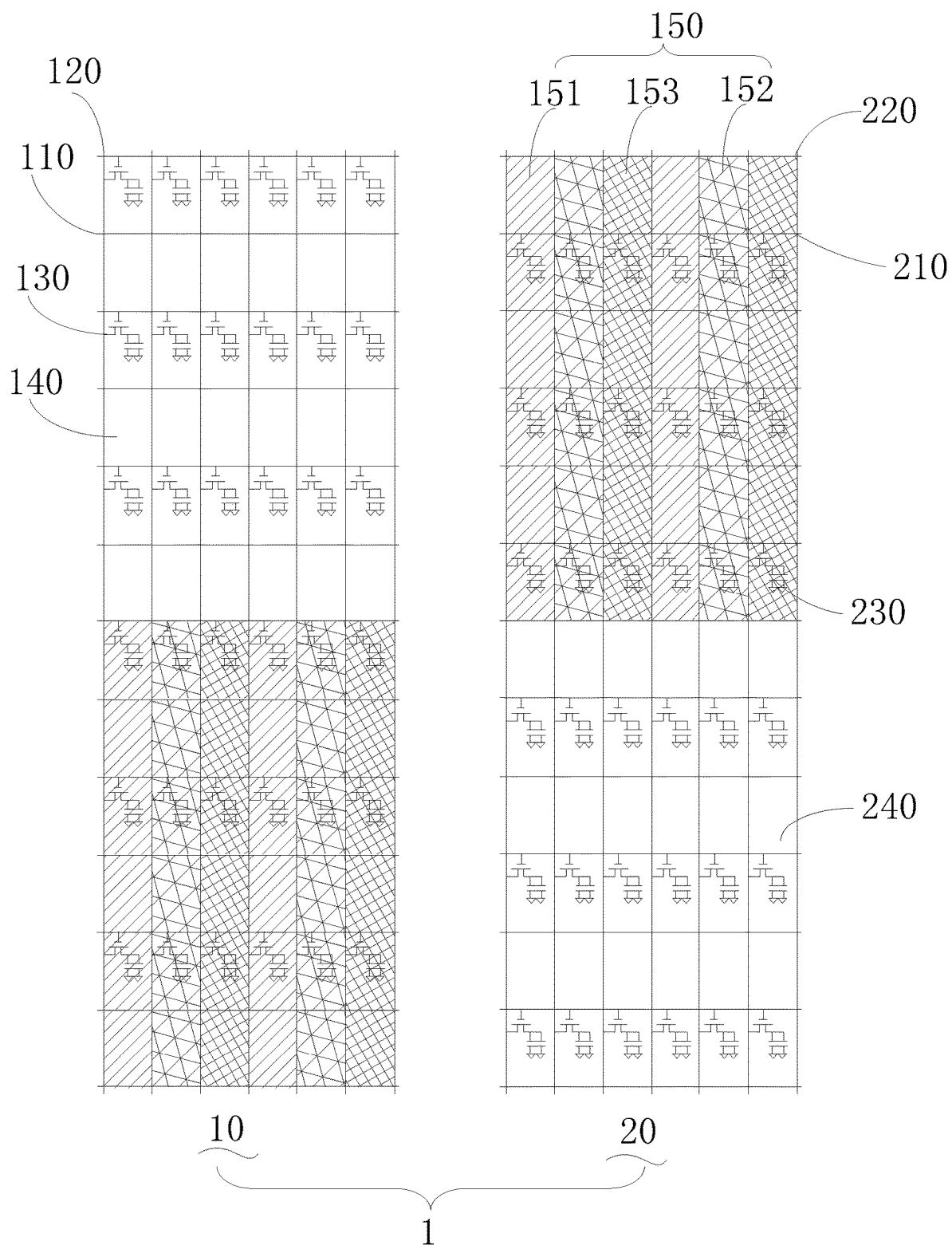
FIG. 2 is a schematic view of a second embodiment of a display panel.

Referring to FIG. 2, FIG. 2 is a schematic view of a second embodiment of a display panel.

In this embodiment, the projections of the portion of the plurality of first pixel areas 140 with the first thin film transistors 130 projected on the second substrate 20 and the portion of the plurality of second pixel areas 240 with the second thin film transistors 230 may be arranged alternately. Specifically, on the first substrate 10, the plurality of first thin film transistors 130 may be respectively arranged in the plurality of first pixel areas 140 spaced from each other at intervals; on the second substrate 20, the plurality of second thin film transistors 230 may be respectively arranged in the plurality of second pixel areas 240 which are corresponding to the plurality of first pixel areas 140 on the first substrate 10 without the first thin film transistor 130. Likewise, on the second substrate 20, the plurality of second thin film transistors 230 may be respectively arranged in the plurality of second pixel areas 240 spaced from each other at intervals, on the first substrate 10, the plurality of first thin film transistors 130 may be respectively arranged in the plurality of first pixel areas 140 which are corresponding to the plurality of second pixel areas 240 on the second substrate 20 without the second thin film transistors 230. That is to say, when the first substrate 10 and the second substrate 20 are stacked on one another, the plurality of first pixel areas 140 with the first thin film transistors 130 are complementary to the plurality of second pixel areas 240 with the second thin film transistors 230, such that the first thin film transistors 130 or the second thin film transistors 230 may be distributed in the plurality of pixel areas when the first substrate 10 and the second substrate 20 are stacked on one another.

Furthermore, on the first substrate 10, the first thin film transistors 130 may be continuously arranged along an extension direction of the plurality of first gate lines 110, and may be arranged at intervals along an extension direction of the plurality of first data lines 120. Similarly, on the second substrate 20, the second thin film transistors 230 may be continuously arranged along an extension direction of the plurality of second gate lines 210 and may be arranged at intervals along an extension direction of the plurality of second data lines 220. That is to say, in this embodiment, the first thin film transistors 130 may be continuously arranged along the extension direction of the plurality of first gate lines 110, and may be arranged at intervals along the extension direction of the plurality of first data lines 120 on the first substrate 10. In the present embodiment, the plurality of first pixel areas 140 with the first thin film transistors 130 may be complementary to the plurality of second pixel areas 240 with the second thin film transistors 230. Therefore, only the arrangement of the plurality of first thin film transistors 130 on the first substrate 10 are described in detail, and the arrangement of the plurality of second thin film transistors 230 on the second substrate 20 is no longer described here.

In this embodiment, the first substrate 10 may be divided into a plurality of setting regions and a plurality of unset regions. Each setting region may include a plurality of first pixel areas 140 with first thin film transistors 130, and each unset region may include a plurality of first pixel areas 140 without first thin film transistors 130.

In this embodiment, the numbers of rows respectively of the first pixel areas 140 in the plurality of setting regions may be the same, and the numbers of rows respectively of the first pixel areas 140 in each unset region may also be the same.

Specifically, in this embodiment, as shown in FIG. 2, H rows of first pixel areas 140 are arranged in each setting region, and K rows of first pixel areas 140 are arranged in each unset region. In this embodiment, 0<K<M−1, 0<H<M−1, wherein K and H are positive integers, M is a total number of rows of first pixel areas 140 on the first substrate 10 along the extension direction of the first data line 120. That is to say, on the first substrate 10, H rows of first pixel areas 140 with the first thin film transistors 130 and K rows of first pixel areas 140 without the first thin film transistors 130 are arranged alternately. And the values respectively of K and H may be the same or different from each other on the same display panel 1000.

In this embodiment, the values respectively of K and H may be the same, that is, on the same display panel 1000, the number of rows of the first pixel areas 140 with the first thin film transistors 130 in the setting region may be the same as the number of rows of the first pixel areas 140 without the first thin film transistors 130 in the unset region. That is to say, on the first substrate 10, H rows of first pixel areas 140 with the first thin film transistors 130 and K rows of first pixel areas 140 without the first thin film transistors 130 are arranged alternately until the arrangement of the first thin film transistors 130 in all of the first pixel areas 140 is completed. In this case, K=H, and the values respectively of K and H may be equal to 1, 2, 3, 10, M−1, and the like. Referring to FIG. 2, FIG. 2 is the arrangement of the first thin film transistors 130 when K=H=1. On the first substrate 10, one row of first pixel areas 140 with the first thin film transistors 130 are arranged, one row of first pixel areas 140 without the first thin film transistors 130 are arranged after that, that is, on the first substrate 10, one row of first pixel areas 140 with the first thin film transistors 130 and one row of first pixel areas 140 without the first thin film transistors 130 are arranged alternately, such that the plurality of setting regions and the plurality of unset regions are arranged alternately.

Since the first thin film transistors 130 are separately arranged in the first substrate 10, the block boundary lines between the first thin film transistors 130 in two adjacent rows may be reduced, the possibility of color deviations may be reduced, and the display effect may be further improved.

Furthermore, because the thin film transistors are arranged in different substrates, it is possible that two thin film transistors arranged on different substrates may be charged at the same time. In this way, the charge efficiency may be greatly improved, thereby reducing the charging time by half. The technical problem of insufficient charging of the display panel may be solved, the display effect of the display panel may be improved, and the penetration rate of the display panel may be enhanced.

Furthermore, as shown in FIGS. 1-2, the display panel 1000 may include a plurality of photoresists 150. In this case, a portion of the plurality of photoresists 150 may be arranged on the first substrate 10, and the others of the plurality of photoresists 150 may be arranged on the second substrate 20. The portion of the plurality of photoresists 150 on the first substrate 10 and the others of the plurality of photoresists 150 on the second substrate 20 may be arranged alternately, such that the plurality of photoresists 150 may be distributed in each pixel area when the first substrate 10 and the second substrate 20 are stacked on one another. In other words, each pixel area may have a photoresist 150 distributed therein. Referring to FIG. 2, the portion of the plurality of photoresists 150 of this embodiment are continuously arranged at one end of the first substrate 10, and the others of the plurality of photoresists 150 are continuously arranged at an opposite end of the second substrate 20, and the portion of the plurality of photoresists 150 arranged on the first substrate 10 and the projections respectively of the others of the plurality of photoresists 150 arranged on the second substrate 20 are continuously arranged after the first substrate 10 and the second substrate 20 are stacked on one another.

Each photoresist 150 may include a red block 151, a green block 152, and a blue block 153 that may be continuously arranged in each of the pixel areas. The red block 151 may be capable of filtering blue lights and green lights and showing red. Similarly, the green block 152 may be capable of filtering red lights and blue lights and showing green. Blue block 153 may be capable of filtering red lights and green lights and showing blue.

In the embodiment shown in FIG. 2, H rows of first pixel areas 140 are arranged in each setting region, and K rows of first pixel areas 140 are arranged in each unset region. Besides, K is equal to H. However, it is also possible that K is not equal to H.

Figure 3:
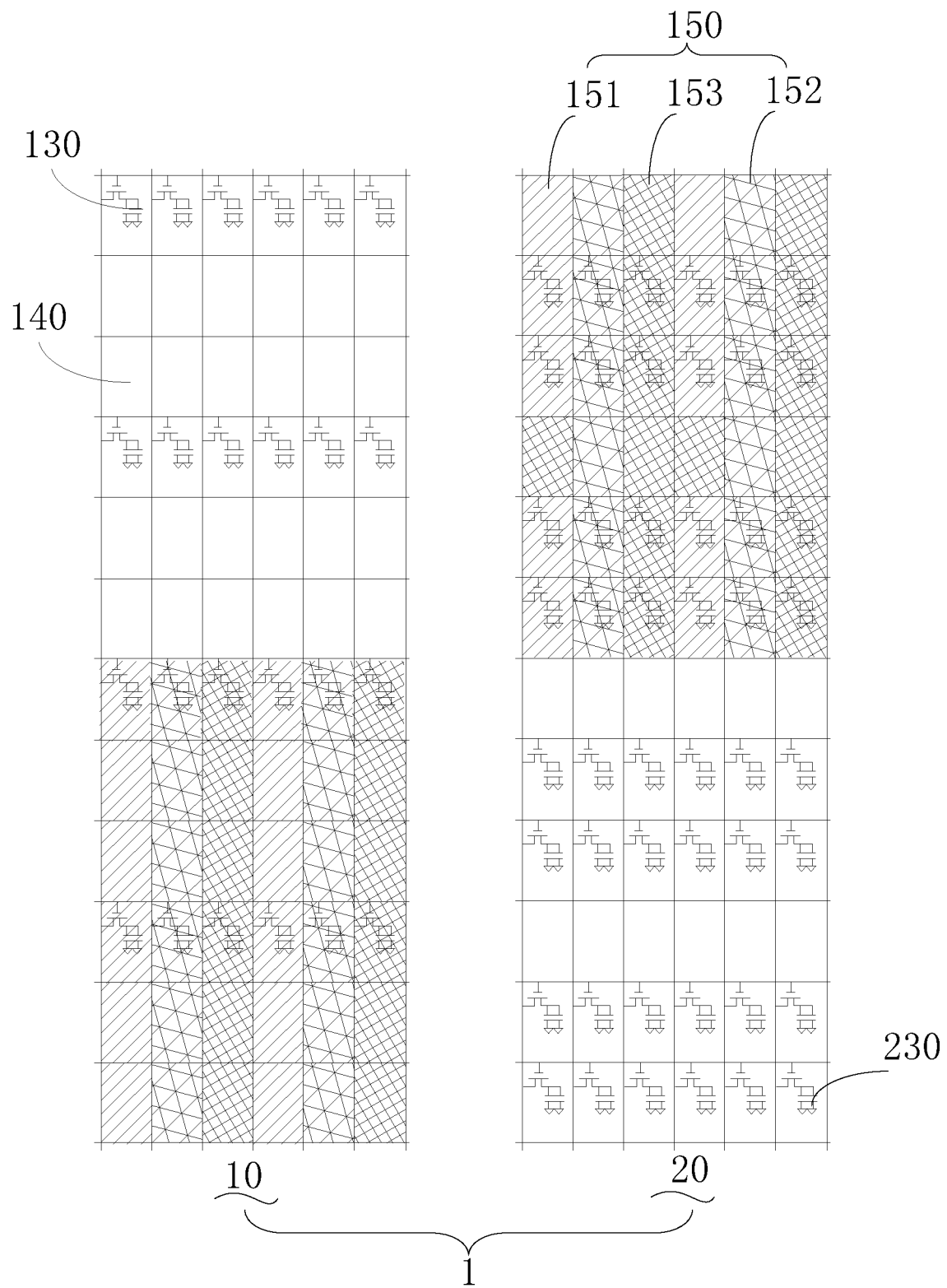
FIG. 3 is a schematic view of a third embodiment of a display panel.

Referring to FIG. 3, FIG. 3 is a schematic view of a third embodiment of a display panel.

In this embodiment, the number of rows H of the plurality of first pixel areas 140 in each setting region may be the same, and the number of rows K of the plurality of first pixel areas 140 in each unset region may be the same, but K is not equal to H. FIG. 3 shows a case in which K=2 and H=1. As shown in FIG. 3, on the first substrate 10, one row of the first pixel areas 140 may be arranged with the first thin film transistors 130, after that, two rows of first pixel areas 140 may be arranged without the first thin film transistors 130, and then one row of the first pixel areas 140 may be arranged with the first thin film transistors 130 further, and the arrangement is repeated in sequence.

In this embodiment, the arrangement of the plurality of photoresists 150 may be similar to the arrangement of the plurality of photoresists 150 in the second embodiment, and will not be described in detail any more.

Figure 4:
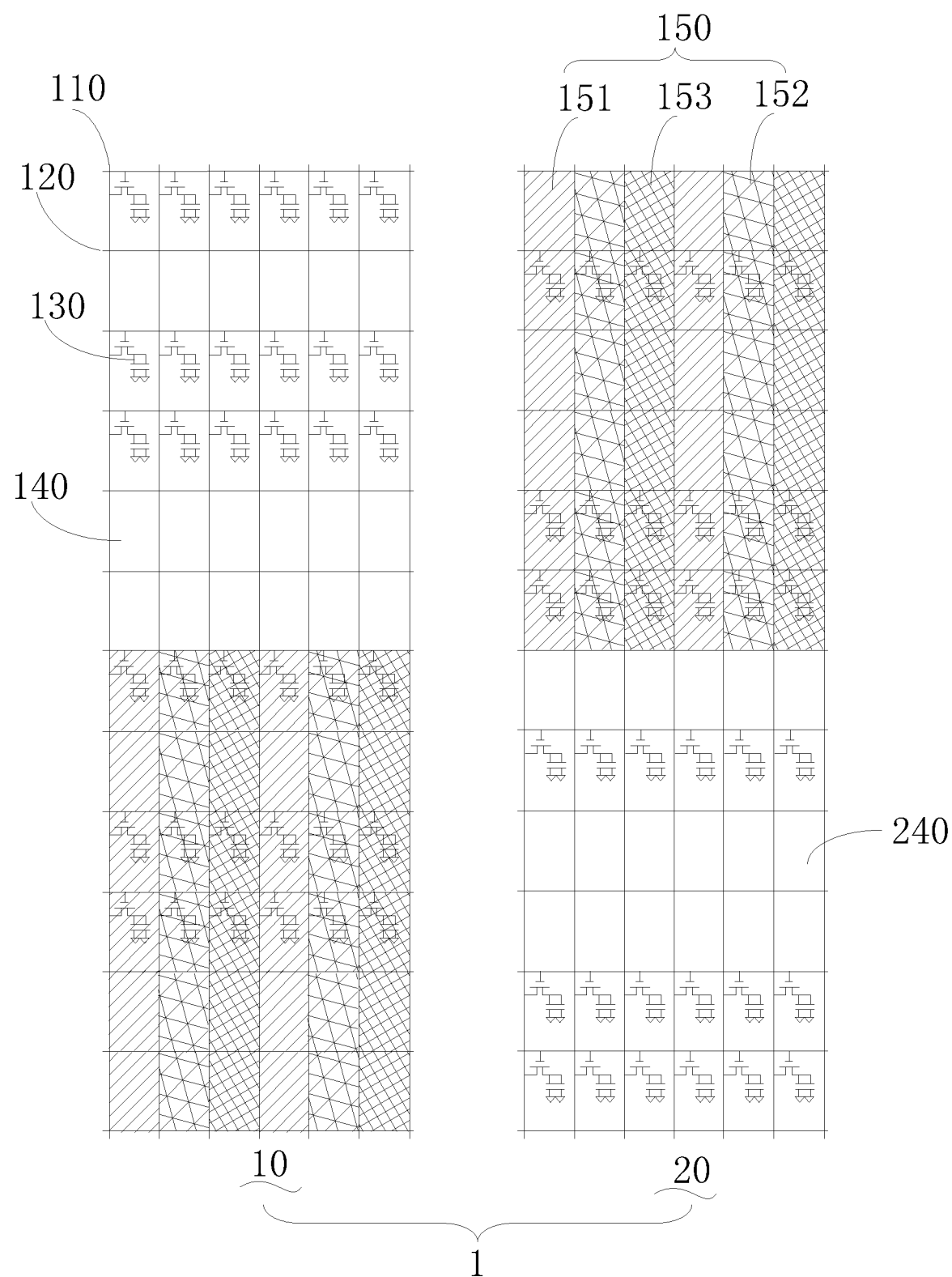
FIG. 4 is a schematic view of a fourth embodiment of a display panel.

Referring to FIG. 4, FIG. 4 is a schematic view of a fourth embodiment of a display panel. In this embodiment, the numbers of rows of the plurality of first pixel areas 140 in the setting regions may be different from each other, and the numbers of rows of the plurality of first pixel areas 140 in the unset regions may also be different from each other. However, the range of the numbers of rows of the plurality of first pixel areas 140 in the setting regions and that of the numbers of rows of the plurality of first pixel areas 140 in the unset regions may be the same. For example, the numbers of rows of the plurality of first pixel areas 140 in the setting regions and the numbers of rows of the plurality of first pixel areas 140 in the unset regions may range from 1 to M−2. As shown in FIG. 4, the numbers of rows of the plurality of first pixel areas 140 in adjacent setting regions have values of 1, 2, 1, 2 successively. The numbers of rows of the plurality of first pixel areas 140 in adjacent unset regions have values of 1, 2, 1, 2 successively. That is to say, after setting one row of first thin film transistors 130 in the first pixel areas 140 on the first substrate 10, one row of the first pixel areas 140 without the first thin film transistors 130 are arranged. After that, two rows of first thin film transistors 130 may be respectively arranged in the two rows of first pixel areas 140. Then, two rows of first pixel areas 140 without the first thin film transistor 130 are arranged successively. After that, one row of first thin film transistors 130 is further arranged in the first pixel area 140 on the first substrate 10, and thus the arrangement is repeated in sequence.

In this embodiment, the arrangement of the plurality of photoresists 150 may be similar to the arrangement of the plurality of photoresists 150 in the second embodiment, and will not be described in detail any more.

Figure 5:
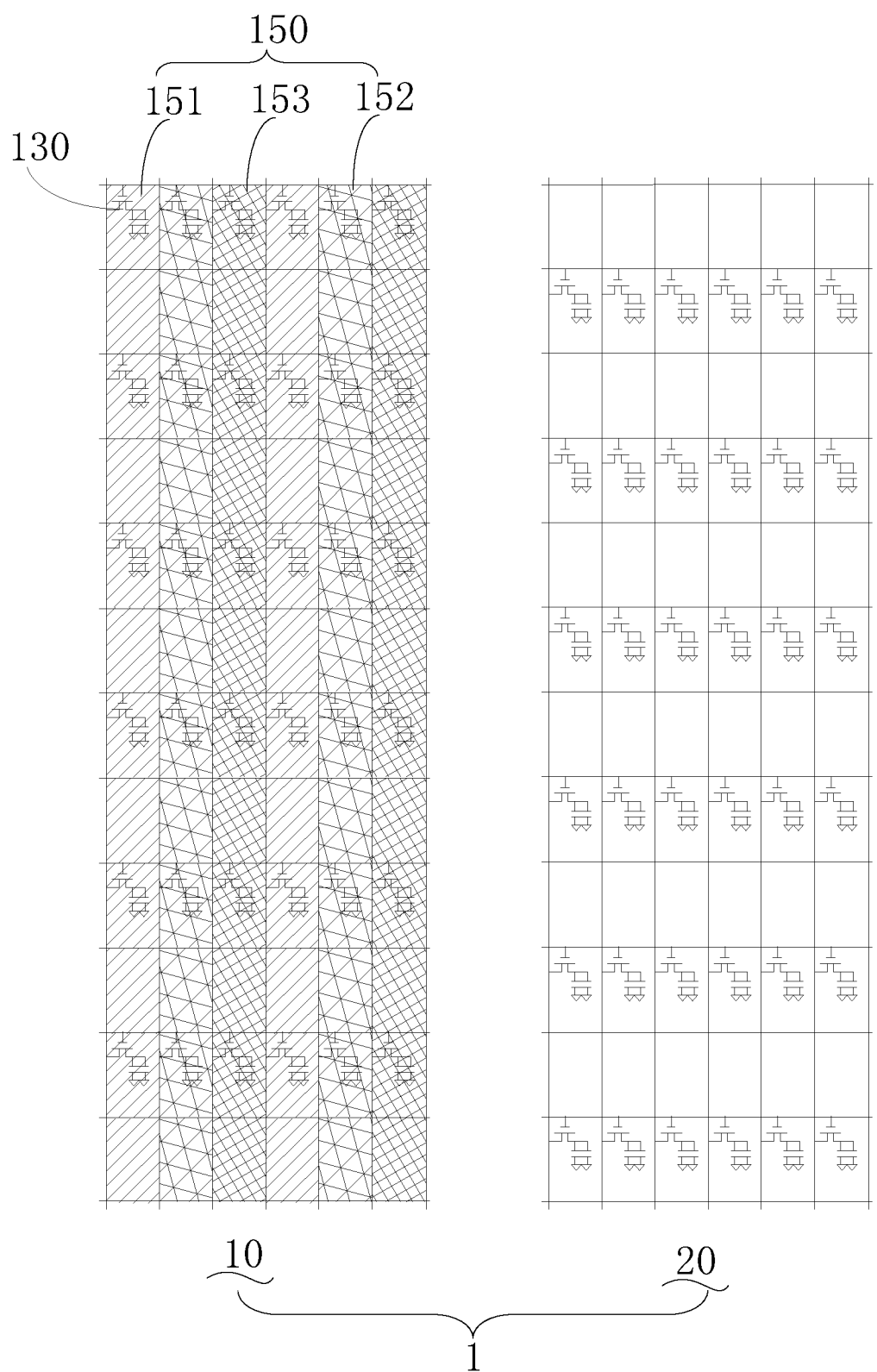
FIG. 5 is a schematic view of a fifth embodiment of a display panel.
Figure 6:
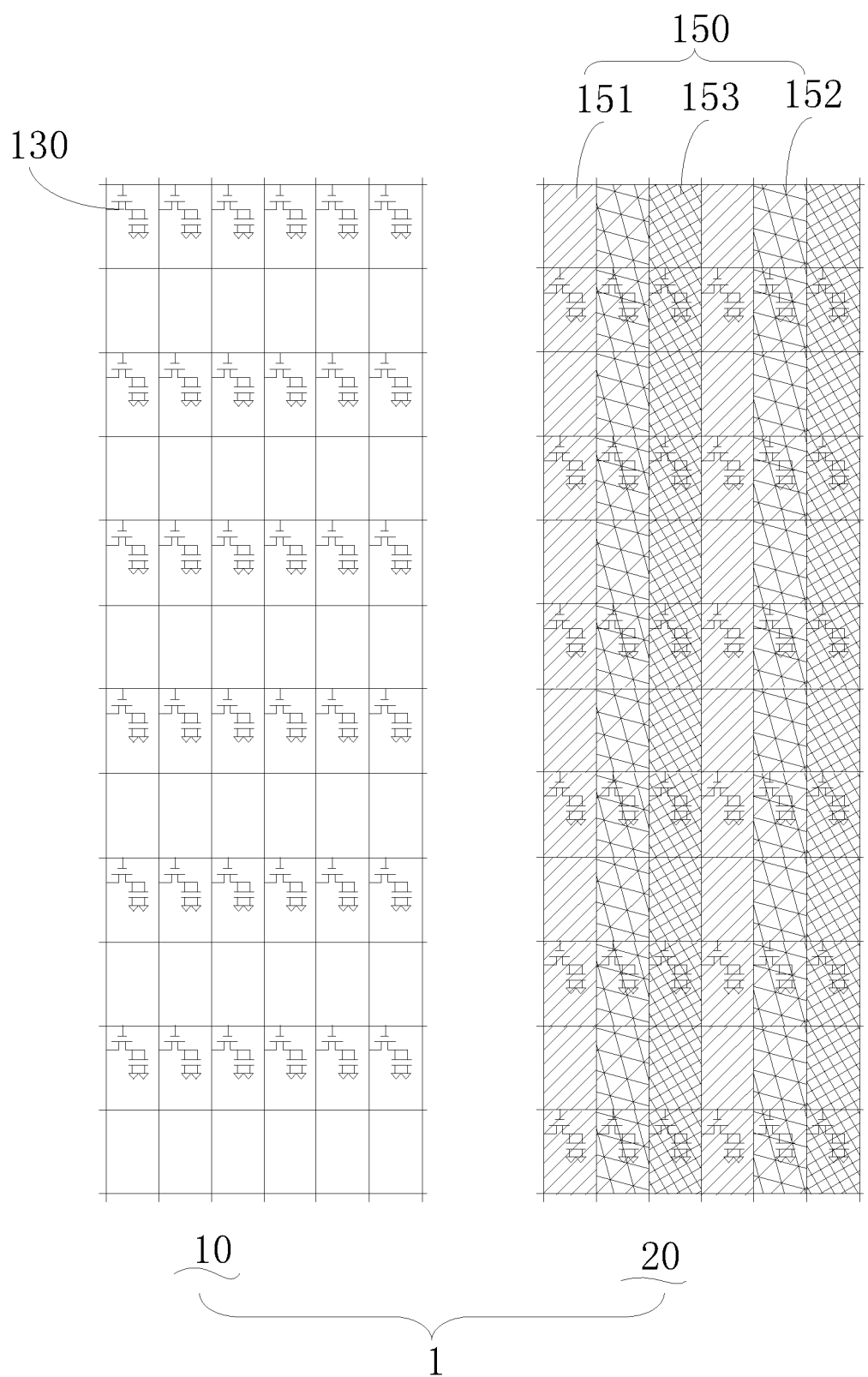
FIG. 6 is a schematic view of a sixth embodiment of a display panel.

Optionally, the plurality of photoresists 150 may also be continuously arranged on the first substrate 10 or continuously arranged on the second substrate 20. Specifically, referring to FIG. 5 and FIG. 6, FIG. 5 is a schematic view of a fifth embodiment of a display panel, and FIG. 6 is a schematic view of a sixth embodiment of a display panel. As shown in FIG. 5, the plurality of photoresists 150 are continuously arranged on the first substrate 10, and the second substrate 20 has no photoresists 150 arranged therein. In other embodiment, as shown in FIG. 6, the plurality of photoresists 150 are continuously arranged on the second substrate 20, and the first substrate 10 has no photoresists 150 arranged therein. In this embodiment, the arrangement of the plurality of first thin film transistors 130 may be the same as that of the second embodiment, and will be no longer described here.

Figure 7:
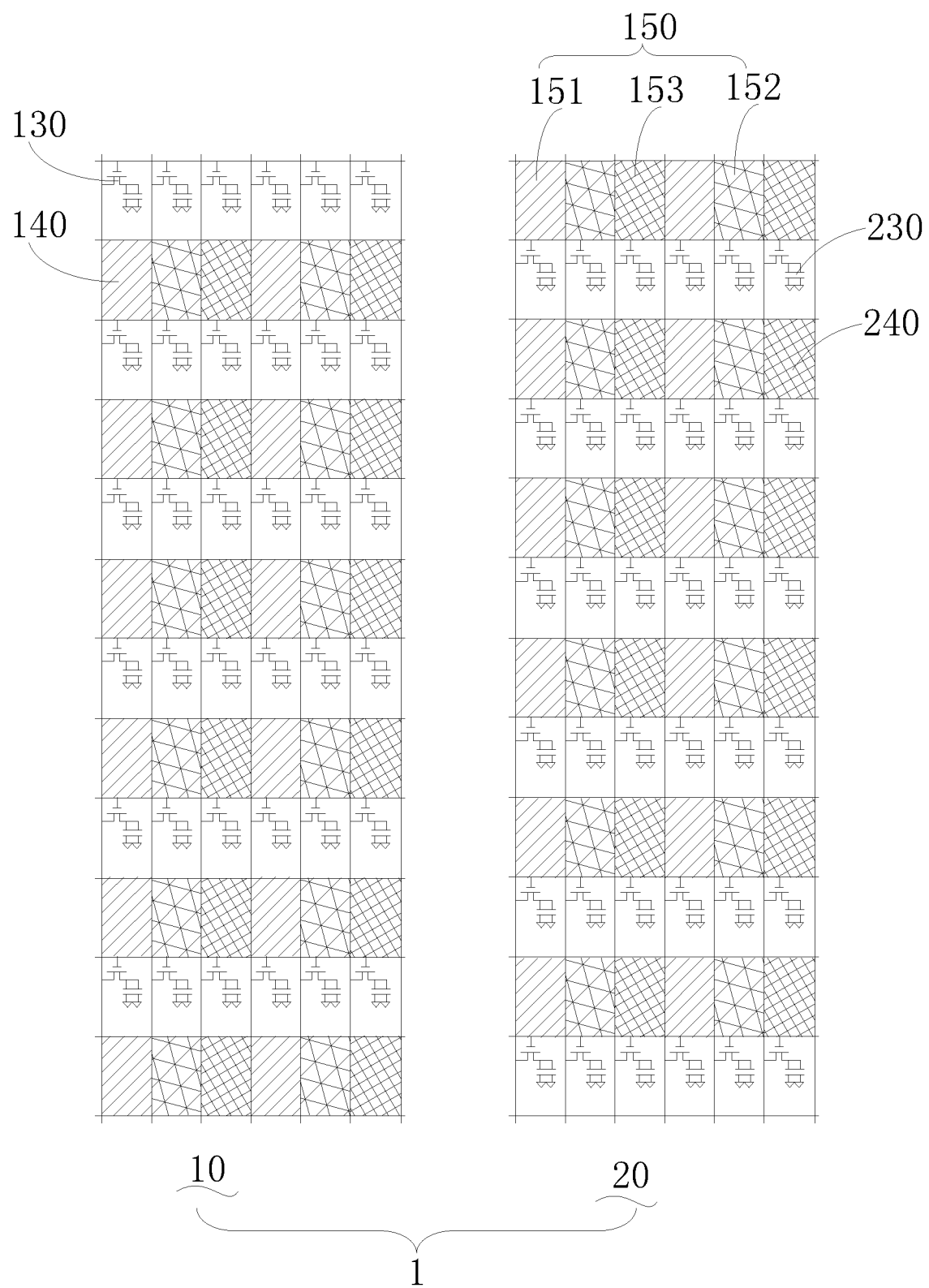
FIG. 7 is a schematic view of a seventh embodiment of a display panel.

Alternatively, the portion of the plurality of photoresists 150 on the first substrate 10 may be arranged in the plurality of first pixel areas 140 without the first thin film transistors 130, and the others of the plurality of photoresists 150 on the second substrate 20 may be arranged in the plurality of second pixel areas 240 without the second thin film transistors 230. Specifically, referring to FIG. 7, FIG. 7 is a schematic view of a seventh embodiment of a display panel. In this embodiment, the portion of the plurality of photoresists 150 on the first substrate 10 are respectively arranged in the plurality of first pixel areas 140 without the first thin film transistors 130, and the others of the plurality of photoresists 150 on the second substrate 20 are respectively arranged in the plurality of second pixel areas 240 without the second thin film transistors 230. In this way, the portion of the plurality of photoresists 150 and the plurality of first thin film transistors 130 may be staggered with each other on the first substrate 10, and the others of the plurality of photoresists 150 and the second thin film transistors 230 may be staggered with each other on the second substrate 20. In this embodiment, the arrangement of the portion of the plurality of first thin film transistors 130 on the first substrate 10 and that of the plurality of second thin film transistors 230 on the second substrate 20 may be the same as those described in the second embodiment, and the arrangement of the plurality of first thin film transistors 130 and that of the plurality of second thin film transistors 230 will no longer be described here.

Figure 8:
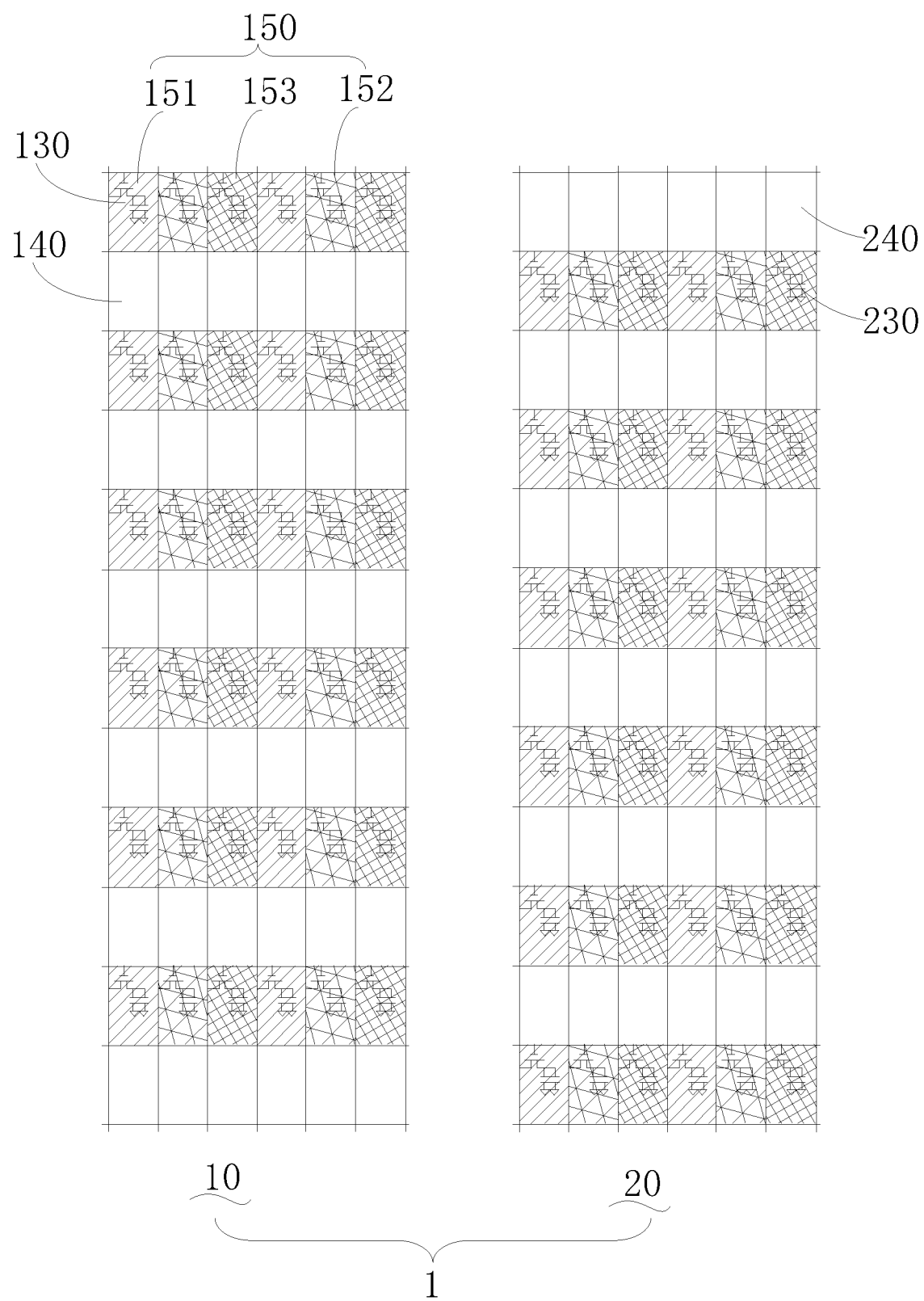
FIG. 8 is a schematic view of an eighth embodiment of a display panel.

Alternatively, the portion of the plurality of photoresists 150 on the first substrate 10 may be respectively arranged in the plurality of first pixel areas 140 with the first thin film transistors 130, and the others of the plurality of photoresists 150 on the second substrate 20 may be respectively arranged in the plurality of second pixel areas 140 with the second thin film transistors 130. Specifically, referring to FIG. 8, and FIG. 8 is a schematic view of an eighth embodiment of a display panel. In the embodiment, the portion of the plurality of photoresists 150 on the first substrate 10 are respectively arranged in the plurality of first pixel areas 140 with the first thin film transistors 130, and the others of the plurality of photoresists 150 on the second substrate 20 are respectively arranged in the plurality of second pixel areas 240 with the second thin film transistors 230. In this embodiment, the arrangement of the plurality of first thin film transistors 130 on the first substrate 10 and that of the plurality of second thin film transistors 230 on the second substrate 20 may be the same as those described in the second embodiment, and the arrangement of the plurality of first thin film transistors 130 and that of the plurality of second thin film transistors 230 will no longer be described here.

In this embodiment, by arranging the plurality of first gate lines 110 and the plurality of first data lines 120 on the first substrate 10, and arranging the plurality of second gate lines 210 and the plurality of second data lines 220 on the second substrate 20, it is possible that two gate lines on different substrates may be working at the same time to charge the at least one thin film transistor. In this way, the charge efficiency may be greatly improved, thereby reducing the charging time by half. The technical problem of insufficient charging of the display panel may be solved, the display effect of the display panel may be improved, and the penetration rate of the display panel may be enhanced. In addition, since the projection of the first pixel area 140 with the first thin film transistor 130 on the second substrate 20 is located between at least two adjacent second pixel areas 240 with the second thin film transistors 230, the generation of the block boundary line between the adjacent thin film transistors may be reduced, the possibility of color deviations may be reduced, and the display effect may be further improved.

Figure 9:
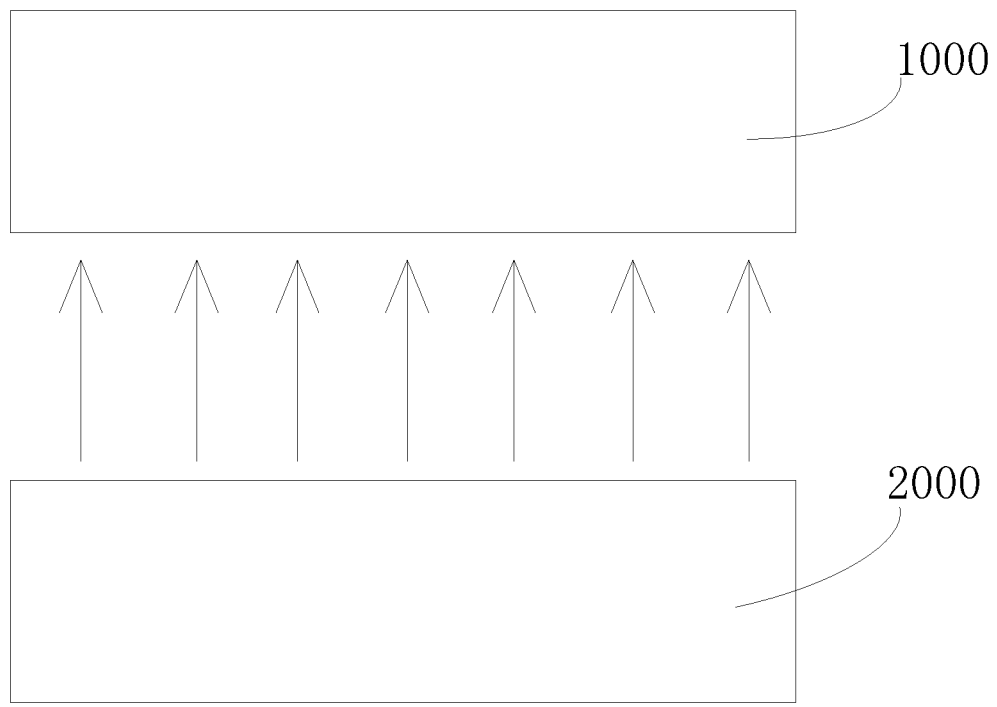
FIG. 9 is a schematic diagram of a display device according to one embodiment of the present disclosure.

The present disclosure also provides a display device, referring to FIG. 9, FIG. 9 is a schematic view of a display device according to one embodiment of the present disclosure. The display device may include the display panel 1000 described in the above-mentioned embodiments, and the structure of the display panel 1000 can be referred to the above embodiment, and will no longer be described here.

Furthermore, the display device may also include a backlight module 2000, and the backlight module may be used to provide a light source for the display panel 1000.

The foregoing is merely embodiments of the present disclosure, and is not intended to limit the scope of the present disclosure. Any equivalent structure or flow transformation made based on the specification and the accompanying drawings of the present disclosure, or any direct or indirect applications of the disclosure on other related fields, shall all be covered within the protection of the present disclosure.

What is claimed is:
1. A display panel, comprising:
a first substrate and a second substrate;
a plurality of first gate lines arranged on the first substrate and a plurality of second gate lines arranged on the second substrate;
a plurality of first data lines arranged on the first substrate and a plurality of second data lines arranged on the second substrate, wherein a plurality of first pixel areas are defined by the plurality of first gate lines and the plurality of first data lines, and a plurality of second pixel areas are defined by the plurality of second gate lines and the plurality of second data lines; when the first substrate and the second substrate are stacked on one another, each of the plurality of first pixel areas and a corresponding second pixel area are aligned with each other, such that a pixel area is formed by each of the plurality of first pixel areas and the corresponding second pixel area; and
a plurality of photoresists, wherein a portion of the plurality of photoresists are arranged on the first substrate, and the others of the plurality of photoresists are arranged on the second substrate; the portion of the plurality of photoresists on the first substrate and the others of the plurality of photoresists on the second substrate are arranged alternately, such that the plurality of photoresists are distributed in the plurality of pixel areas when the first substrate and the second substrate are stacked on one another;
wherein a plurality of first thin film transistors are disposed in a portion of the plurality of first pixel areas, and a plurality of second thin film transistors are disposed in a portion of the plurality of second pixel areas, such that projections of the portion of the plurality of first pixel areas with the first thin film transistors projected on the second substrate are located between at least two adjacent second pixel areas with the second thin film transistors;
wherein the projections of the portion of the plurality of first pixel areas with the first thin film transistors projected on the second substrate and the portion of the plurality of second pixel areas with the second thin film transistors are arranged alternately.

2. The display panel of claim 1, wherein the first thin film transistors on the first substrate are continuously arranged along an extension direction of the plurality of first gate lines, and are spaced from each other at intervals along an extension direction of the plurality of first data lines;
the second thin film transistors on the second substrate are continuously arranged along an extension direction of the plurality of second gate lines, and are spaced from each other at intervals along an extension direction of the plurality of second data lines.

3. The display panel of claim 1, wherein the portion of the plurality of photoresists on the first substrate are arranged in the plurality of first pixel areas without the first thin film transistors, and the others of the plurality of photoresists on the second substrate are arranged in the plurality of second pixel areas without the second thin film transistors.

4. A display panel, comprising:
a first substrate and a second substrate;

a plurality of first gate lines arranged on the first substrate and a plurality of second gate lines arranged on the second substrate;

a plurality of first data lines arranged on the first substrate and a plurality of second data lines arranged on the second substrate, wherein a plurality of first pixel areas are defined by the plurality of first gate lines and the plurality of first data lines, and a plurality of second pixel areas are defined by the plurality of second gate lines and the plurality of second data lines; when the first substrate and the second substrate are stacked on one another, each of the plurality of first pixel areas and a corresponding second pixel area are aligned with each other, such that a pixel area is formed by each of the plurality of first pixel areas and the corresponding second pixel area;

wherein a plurality of first thin film transistors are disposed in a portion of the plurality of first pixel areas, and a plurality of second thin film transistors are disposed in a portion of the plurality of second pixel areas, such that projections of the portion of the plurality of first pixel areas with the first thin film transistors projected on the second substrate are located between at least two adjacent second pixel areas with the second thin film transistors.

5. The display panel of claim 4, wherein the projections of the portion of the plurality of first pixel areas with the first thin film transistors projected on the second substrate and the portion of the plurality of second pixel areas with the second thin film transistors are arranged alternately.

6. The display panel of claim 5, wherein the first thin film transistors on the first substrate are continuously arranged along an extension direction of the plurality of first gate lines, and are spaced from each other at intervals along an extension direction of the plurality of first data lines;

the second thin film transistors on the second substrate are continuously arranged along an extension direction of the plurality of second gate lines, and are spaced from each other at intervals along an extension direction of the plurality of second data lines.

7. The display panel of claim 4, further comprising a plurality of photoresists, wherein the plurality of photoresists are continuously arranged on the first substrate or continuously arranged on the second substrate.

8. The display panel of claim 4, further comprising a plurality of photoresists, wherein a portion of the plurality of photoresists are arranged on the first substrate, and the others of the plurality of photoresists are arranged on the second substrate; the portion of the plurality of photoresists on the first substrate and the others of the plurality of photoresists on the second substrate are arranged alternately, such that the plurality of photoresists are distributed in the plurality of pixel areas when the first substrate and the second substrate are stacked on one another.

9. The display panel of claim 8, wherein the portion of the plurality of photoresists on the first substrate are arranged in the plurality of first pixel areas without the first thin film transistors, and the others of the plurality of photoresists on the second substrate are arranged in the plurality of second pixel areas without the second thin film transistors.

10. The display panel of claim 7, wherein each photoresist comprise a red block, a green block, and a blue block that are continuously arranged in each of the pixel areas.

11. A display device, comprising a display panel, the display panel comprising:

a first substrate and a second substrate;

a plurality of first gate lines arranged on the first substrate and a plurality of second gate lines arranged on the second substrate;

a plurality of first data lines arranged on the first substrate and a plurality of second data lines arranged on the second substrate, wherein a plurality of first pixel areas are defined by the plurality of first gate lines and the plurality of first data lines, and a plurality of second pixel areas are defined by the plurality of second gate lines and the plurality of second data lines; when the first substrate and the second substrate are stacked on one another, each of the plurality of first pixel areas and a corresponding second pixel area are aligned with each other, such that a pixel area is formed by each of the plurality of first pixel areas and the corresponding second pixel area;

wherein a plurality of first thin film transistors are disposed in a portion of the plurality of first pixel areas, and a plurality of second thin film transistors are disposed in a portion of the plurality of second pixel areas, such that projections of the portion of the plurality of first pixel areas with the first thin film transistors projected on the second substrate are located between at least two adjacent second pixel areas with the second thin film transistors.

12. The display device of claim 11, wherein the projections of the portion of the plurality of first pixel areas with the first thin film transistors projected on the second substrate and the portion of the plurality of second pixel areas with the second thin film transistors are arranged alternately.

13. The display device of claim 12, wherein the first thin film transistors on the first substrate are continuously arranged along an extension direction of the plurality of first gate lines, and are spaced from each other at intervals along an extension direction of the plurality of first data lines;

the second thin film transistors on the second substrate are continuously arranged along an extension direction of the plurality of second gate lines, and are spaced from each other at intervals along an extension direction of the plurality of second data lines.

14. The display device of claim 11, further comprising a plurality of photoresists, wherein the plurality of photoresists are continuously arranged on the first substrate or continuously arranged on the second substrate.

15. The display device of claim 11, further comprising a plurality of photoresists, wherein a portion of the plurality of photoresists are arranged on the first substrate, and the others of the plurality of photoresists are arranged on the second substrate; the portion of the plurality of photoresists on the first substrate and the others of the plurality of photoresists on the second substrate are arranged alternately, such that the plurality of photoresists are distributed in the plurality of pixel areas when the first substrate and the second substrate are stacked on one another.

16. The display device of claim 15, wherein the portion of the plurality of photoresists on the first substrate are arranged in the plurality of first pixel areas without the first thin film transistors, and the others of the plurality of photoresists on the second substrate are arranged in the plurality of second pixel areas without the second thin film transistors.

17. The display device of claim 11, further comprising a backlight module configured to provide light source for the display panel.

* * * * *